United States Patent
Lo et al.

(10) Patent No.: US 10,277,171 B2
(45) Date of Patent: Apr. 30, 2019

(54) SEMICONDUCTOR DEVICE HAVING A LOW POWER CONSUMPTION

(71) Applicant: Taiwan Semiconductor Manufacturing Company Limted, Hsinchu (TW)

(72) Inventors: An-Hsun Lo, Hsinchu (TW);
En-Hsiang Yeh, Hsinchu (TW);
Tzu-Jin Yeh, Hsinchu (TW);
Wen-Sheng Chen, Taipei (TW)

(73) Assignee: Taiwan Semiconductor Manufacturing Company Limted, Hsinchu (TW)

( * ) Notice: Subject to any disclaimer, the term of this patent is extended or adjusted under 35 U.S.C. 154(b) by 0 days.

(21) Appl. No.: 15/641,596

(22) Filed: Jul. 5, 2017

(65) Prior Publication Data

US 2018/0198418 A1    Jul. 12, 2018

Related U.S. Application Data

(60) Provisional application No. 62/445,335, filed on Jan. 12, 2017.

(51) Int. Cl.
*H03F 3/45* (2006.01)
*H03F 1/30* (2006.01)
*H03F 3/193* (2006.01)

(52) U.S. Cl.
CPC ............ *H03F 1/301* (2013.01); *H03F 3/193* (2013.01); *H03F 3/45183* (2013.01); *H03F 3/45246* (2013.01); *H03F 3/45475* (2013.01); *H03F 3/45632* (2013.01); *H03F 3/45928* (2013.01); *H03F 2200/135* (2013.01); *H03F 2200/294* (2013.01); *H03F 2200/447* (2013.01); *H03F 2200/451* (2013.01); *H03F 2200/462* (2013.01); *H03F 2200/471* (2013.01); *H03F 2203/45116* (2013.01); *H03F 2203/45512* (2013.01)

(58) Field of Classification Search
CPC ...... H03F 1/301; H03F 3/193; H03F 3/45246; H03F 1/34; H03F 3/45; H03F 3/45071; H03F 3/45183; H03F 3/45479; H03F 3/4565; H03F 3/45659; H03F 3/45475; H03F 3/45188; H03F 3/45192
USPC ................................ 330/253, 258, 260, 261
See application file for complete search history.

(56) References Cited

U.S. PATENT DOCUMENTS

| | | | | |
|---|---|---|---|---|
| 4,543,538 A * | 9/1985 | Fay | ..................... | H03F 3/45085 330/252 |
| 5,668,468 A * | 9/1997 | Cargill | ..................... | G05F 3/242 323/316 |
| 6,806,771 B1 * | 10/2004 | Hildebrant | ............ | H03F 1/3211 330/278 |
| 7,358,805 B2 * | 4/2008 | Shia | ........................ | G11C 7/062 330/258 |

(Continued)

*Primary Examiner* — Khanh V Nguyen
(74) *Attorney, Agent, or Firm* — Jones Day (57) ABSTRACT

An amplifying unit includes a converter and a feedback mechanism. The converter has a supply input coupled to a supply node. The converter further has an input terminal configured to receive an input signal. The converter is configured to amplify the input signal from the input terminal to generate an output signal. The feedback mechanism is coupled to the input terminal of the converter and is configured to cause a constant bias current to flow from the supply node through the converter based on the input signal.

20 Claims, 9 Drawing Sheets

(56) References Cited

U.S. PATENT DOCUMENTS 9,531,337 B2 * 12/2016 Chen .................. H03F 3/45479

* cited by examiner

SEMICONDUCTOR DEVICE HAVING A LOW POWER CONSUMPTION

CROSS-REFERENCE TO RELATED APPLICATION

This application claims priority to U.S. Provisional Patent Application No. 62/445,335, filed Jan. 12, 2017, which is incorporated herein by reference in its entirety.

BACKGROUND

Operating characteristics of transistors, such as field-effect transistors (FET), from which a circuit, e.g., an amplifier, is typically constructed change with variations in manufacturing processes, as well as with variations in operating conditions, e.g., supply voltages and temperatures. This is often referred to as process, voltage, temperature (PVT) variations. PVT variations in a circuit can result in erroneous operation of the circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A current-to-voltage converter is configured to amplify a current signal at an input terminal thereof to generate a voltage signal. The converter is connected to a supply node at which a supply voltage, e.g., 0.5V, is applied, whereby a bias current flows from the supply node through the converter. The bias current may undesirably change with process, voltage, temperature (PVT) variations, resulting in erroneous operation of the converter. To cope with the PVT variations, a bias current generator for generating a constant bias current may be connected between the supply node and the converter. Although this arrangement has been found to work satisfactorily, it is difficult, if not impossible, to lower the supply voltage. Thus, such a converter has high power consumption.

Systems and methods as described herein include a converter, e.g., converter 120 (shown in FIG. 1), and a feedback mechanism, e.g., feedback mechanism 130, that obviate the need for a bias current generator to be implemented between a supply node 140 and the converter 120. The converter 120 and the feedback mechanism 130 constitute an amplifying unit. The converter 120 is configured to amplify an input signal (IN1/IN2) at an input terminal thereof to generate an output signal. The feedback mechanism 130 is connected to the input terminal of the converter 120, not between the supply node 140 and the converter 120, and is configured to cause a constant bias current (Ibias), i.e., a bias current independent of PVT variations (e.g., originating from the supply node 140), to flow from the supply node 140 through the converter 120. This is because, as further explained below, the feedback mechanism 130 generates a reference voltage using a constant source current and causes a direct current (DC) component (Vdc) of the input signal (IN1/IN2) to be substantially equal to the reference voltage. Such an arrangement permits lowering of a supply voltage (Vdd) to less than a supply voltage in a conventional arrangement such as that described above, thereby reducing power consumption of the converter 120 of the present disclosure.

Figure 1:
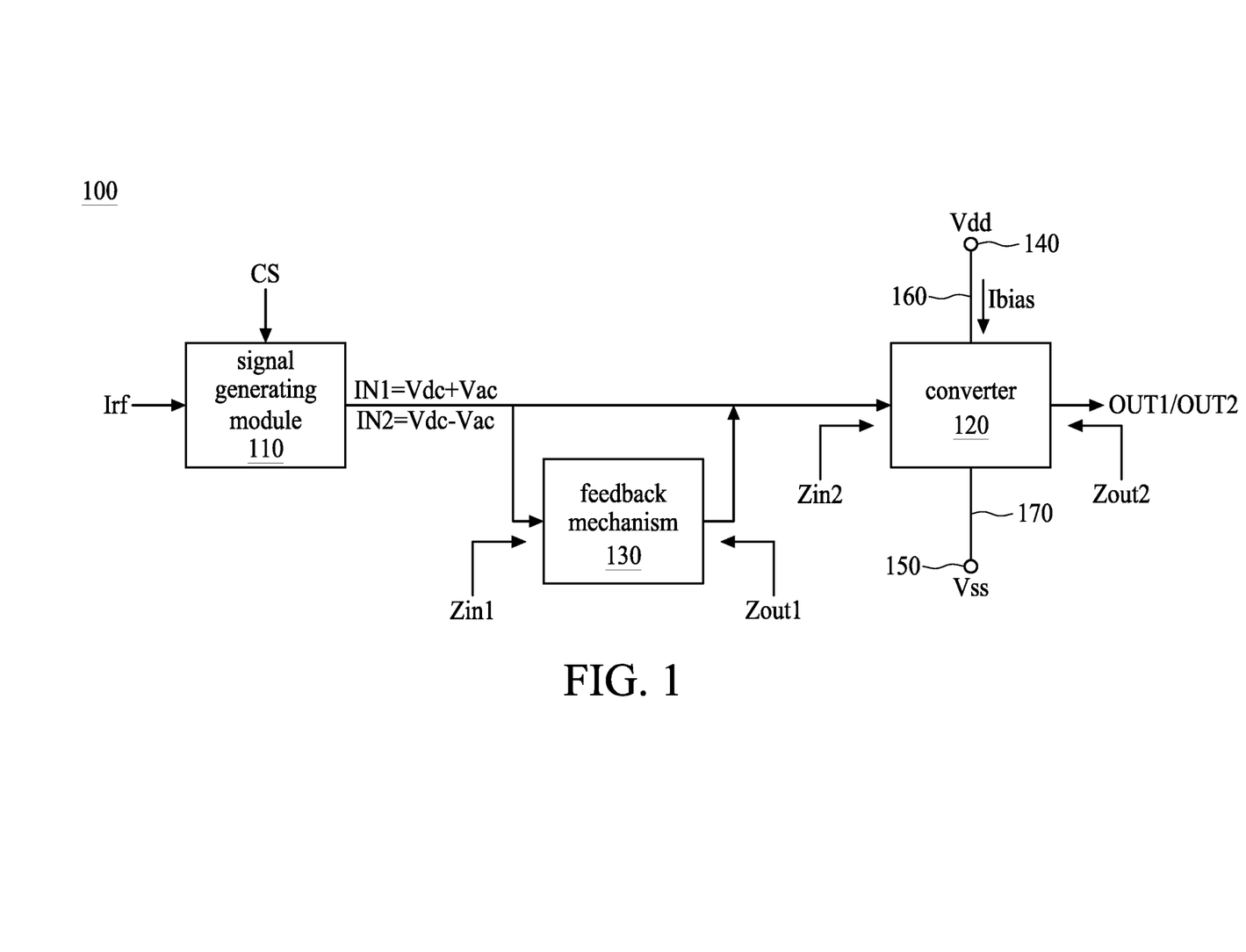
FIG. 1 is a schematic diagram illustrating an exemplary semiconductor device in accordance with some embodiments.

In some embodiments, by virtue of the feedback mechanism 130, bias current (Ibias) variation is minimized by as much as 75% and a signal to noise (S/N) ratio is considerably improved when compared to converters in other approaches. Further, the feedback mechanism 130 has no significant effect on an input transconductance of the converter 120 and thus does not degrade the input signal (IN1/IN2).

Figure 2:
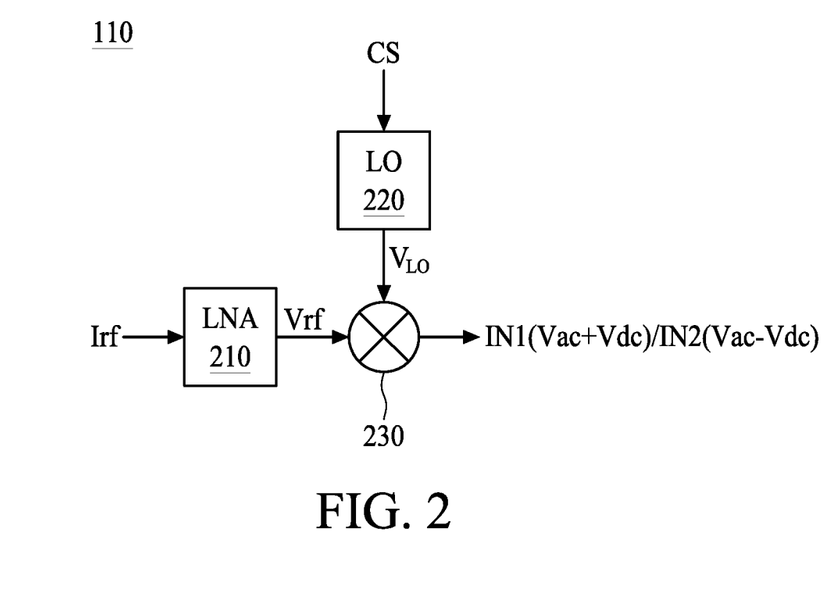
FIG. 2 is a schematic diagram illustrating an exemplary signal generating module in accordance with some embodiments.

In further detail, FIG. 1 is a schematic diagram illustrating an exemplary semiconductor device 100 in accordance with some embodiments. The semiconductor device 100 includes a signal generating module 110, a converter 120, and a feedback mechanism 130. In embodiments, the semiconductor device 100, is a radio frequency (RF) receiver and the signal generating module 110 is configured to receive an RF input signal (Irf), e.g., an up-converted baseband signal transmitted by an RF transmitter. The signal generating module 110 is further configured to downconvert the RF input signal (Irf) to generate a baseband input signal (IN1/IN2) for further processing, such as by a digital signal processor (DSP), to obtain information that contains audio, video, text, or a combination thereof. An exemplary signal generating module 110 circuit is illustrated in FIG. 2, which depicts a schematic diagram that illustrates an exemplary signal generating module 110 in accordance with various embodiments. It is understood that this circuit for the signal generating module 110 is provided by way of example, not by limitation, and other suitable signal generating module 110 circuits are within the scope of the present disclosure.

The signal generating module 110 of FIG. 2 includes a low noise amplifier (LNA) 210, a local oscillator (LO) 220, and a mixer 230. The LNA 210 is operable to amplify RF input signal (Irf), e.g., a current signal, to generate an RF output signal (Vrf), e.g., a voltage signal. Irf may be received by an antenna and then routed to the LNA 210 through a duplexer/switch. The LO 220 is configured to receive a control signal (CS) to generate a LO signal ($V_{LO}$) that has a same frequency as a carrier frequency of the RF output signal (Vrf). The mixer 230 downconverts the RF output signal (Vrf) thereby mixing the RF output signal (Vrf) with the LO signal ($V_{LO}$) from the LO 220 to generate, a baseband input signal (IN1/IN2), e.g., a current signal.

Referring back to FIG. 1, the converter 120, e.g., a baseband amplifier, is a current-to-voltage converter and has first and second supply inputs 160, 170 connected to first and second supply nodes 140, 150, respectively. The first supply node 140 is configured to receive a first supply voltage (Vdd), e.g., about 0.4V. The second supply node 150 is configured to receive a second supply voltage (Vss), e.g., about 0V, lower than the first supply voltage (Vdd). The converter 120 is configured to amplify the baseband input signal (IN1/IN2) to generate a baseband output signal (OUT1/OUT2), e.g., a voltage signal. In an alternative embodiment, the converter 120 is a current-to-current converter, a voltage-to-current converter, or a voltage-to-voltage converter.

Although the semiconductor device 100 is exemplified as an RF receiver, the semiconductor device 100 may be any receiver circuit or any other circuit. For example, in an embodiment, the semiconductor device 100 is an optical receiver that translates a light signal sent through a fiber optic into an electrical signal. In such an embodiment, the semiconductor device 100 includes a photodiode configured to receive a light signal from a fiber optic medium to generate a photocurrent/photovoltage. The converter 120 is configured to amplify the photocurrent/photovoltage to generate a voltage/current signal.

Figure 3A:
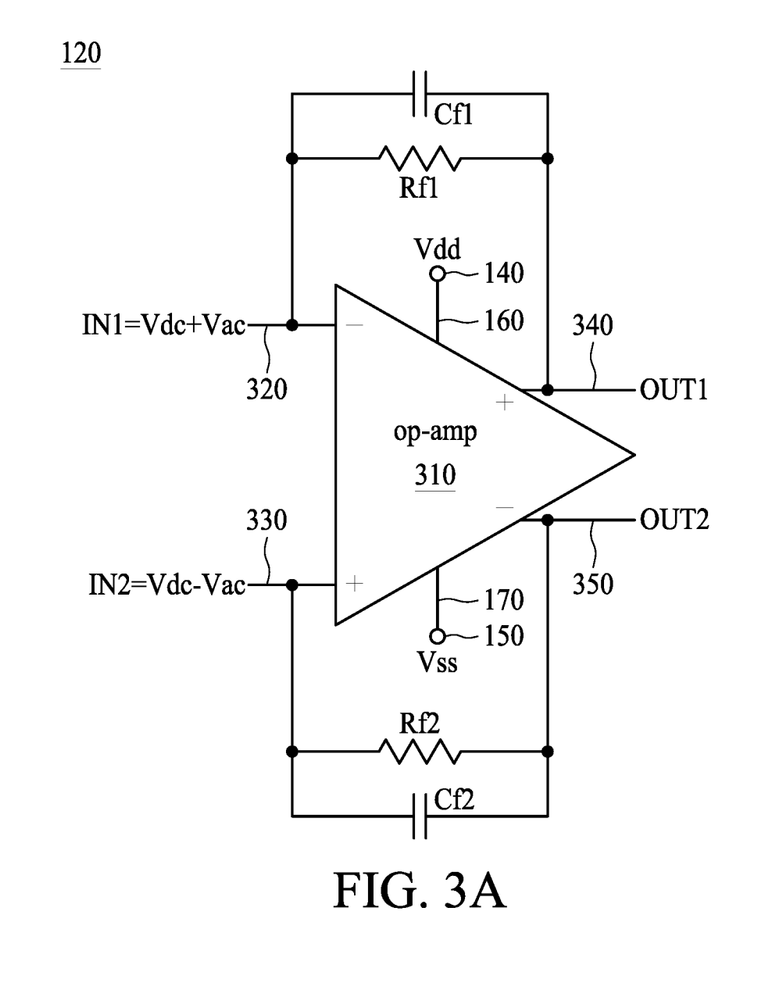
FIG. 3A is a schematic diagram illustrating an exemplary transimpedance amplifier in accordance with some embodiments.
Figure 3B:
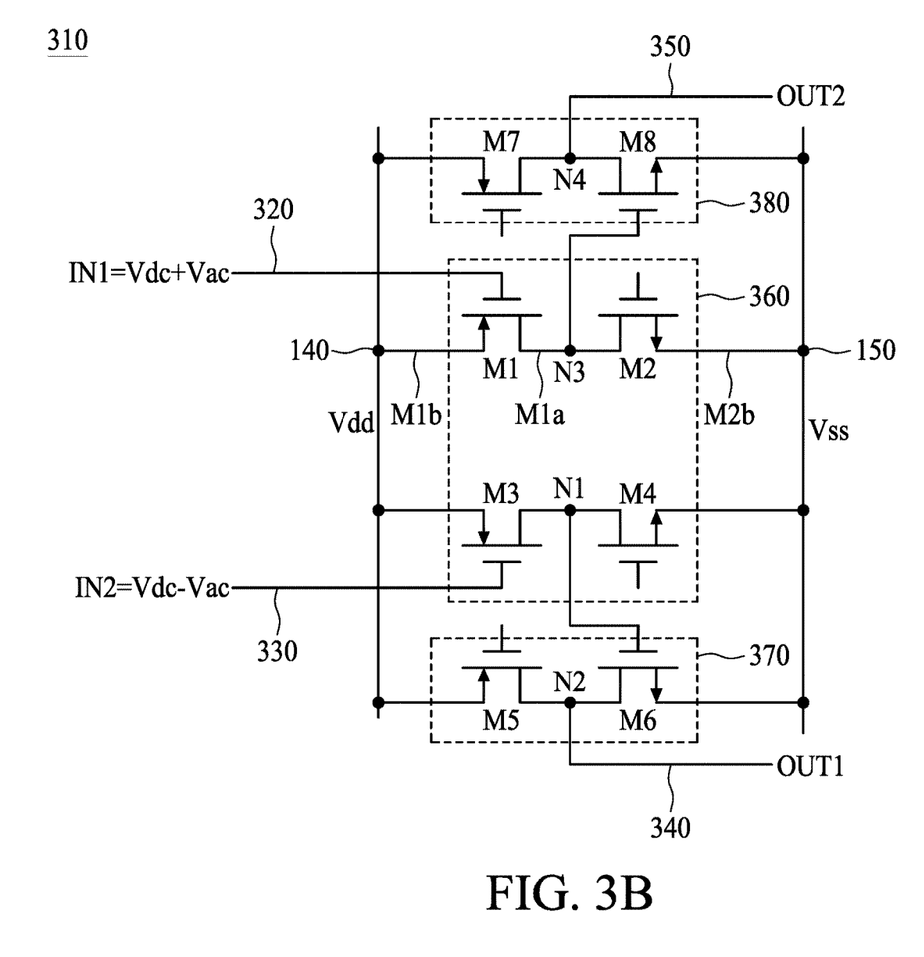
FIG. 3B is a schematic diagram illustrating an exemplary operational amplifier in accordance with some embodiments.

Example circuits for the converter 120 are depicted in FIGS. 3A and 3B. It is understood that these circuits are provided by way of example, not by limitation, and other suitable converter 120 circuits are within the scope of the present disclosure. FIG. 3A is a schematic diagram illustrating an exemplary transimpedance amplifier (TIA) in accordance with some embodiments. The example of FIG. 3A includes a fully differential operational amplifier (op-amp) 310, a pair of feedback resistors (Rf1, Rf2), and a pair of feedback capacitors (Cf1, Cf2). The op-amp 310 has a first input terminal 320, e.g., an inverting input terminal, a second input terminal 330, e.g., a non-inverting input terminal, a first output terminal 340, e.g., a non-inverting output terminal, and a second output terminal 350, e.g., an inverting output terminal. In an alternative embodiment, the converter 120 includes a differential amplifier that has inverting and non-inverting input terminals and a single output terminal or any type of amplifier.

Each of the feedback resistors (Rf1, Rf2) is connected between a respective one of the first and second input terminals 320, 330 of the op-amp 310 and a respective one of the first and second output terminals 340, 350 of the op-amp 310. Each of the feedback capacitors (Cf1, Cf2) is connected in parallel to a respective one of the feedback resistors (Rf1, Rf2). In an alternative embodiment, at least one of the feedback resistors/capacitors can be replaced with any suitable resistive/capacitive element.

The op-amp 310 is configured to receive at the first input terminal 320 thereof a first input signal (IN1), e.g., a current signal, that has a DC component (Vdc) and an AC component (Vac). The op-amp 310 is further configured to receive at the second input terminal 330 thereof a second input signal (IN2) identical to, but 180 degrees out-of-phase with, the first input signal (IN1). The op-amp 310 is further configured to amplify the first and second input signals (IN1, IN2) to generate first and second output signals (OUT1, OUT2) provided at the first and second output terminals 340, 350 thereof, respectively. The input signal (IN1/IN2) includes a plurality of channel signals. The feedback capacitors (Cf1, Cf2) and the feedback resistors (Rf1, Rf2) form a channel filter configured to pass a desired channel signal, but attenuate undesired channel signals, of the input signal (IN1/IN2).

FIG. 3B is a schematic diagram illustrating an exemplary op-amp 310 in accordance with some embodiments. The example of FIG. 3B is implemented using field-effect transistors (FETs) and includes a pseudo-differential amplifier 360, a first output stage 370, and a second output stage 380. The pseudo-differential amplifier 360 includes a first pair of p-type and n-type FETs (M1, M2) and a second pair of p-type and n-type FETs (M3, M4). The FETs (M1, M2) are connected in series between the first and second supply nodes 140, 150. That is, first source/drain terminals (M1a, M2a) of the FETs (M1, M2) are connected to each other and second source/drain terminals (M1b, M2b) of the FETs (M1, M2) are connected to the first and second supply nodes 140, 150, respectively. A gate terminal of the FET (M1) serves as the first input terminal 320 of the op-amp 310. Similarly, the FETs (M3, M4) are connected in series between the first and second supply nodes 140, 150. A gate terminal of the FET (M3) serves as the second input terminal 330 of the op-amp 310.

The first output stage 370 includes a pair of p-type and n-type FETs (M5, M6) connected in series between the first and second supply nodes 140, 150. A gate terminal of the FET (M6) is connected to a node (N1) between the FETs (M3, M4). A node (N2) between the FETs (M5, M6) serves as the first output terminal 340 of the op-amp 310. Similarly, the second output stage 380 includes a pair of p-type and n-type FETs (M7, M8) connected in series between the first and second supply nodes 140, 150. A gate terminal of the FET (M8) is connected to a node (N3) between the FETs (M1, M2). A node (N4) between the FETs (M7, M8) serves as the second output terminal 350 of the op-amp 310. The FETs (M1-M8) are configured to set a gain of the pseudo op-amp 310. That is, the FETs (M1, M2) are configured to amplify the first input signal (IN1) to generate a first voltage at the node (N3) that has a larger amplitude than the first input signal (IN1). The FETs (M7, M8) are configured to amplify the first voltage to generate a second voltage, i.e., a second output signal (OUT2), at the node (N4) that has an amplitude larger than the first voltage. Similarly, the FETs (M3, M4) are configured to amplify the second input signal (IN2) to generate a third voltage at the node (N1) that has an amplitude larger than the second input signal (IN2). The FETs (M5, M6) are configured to amplify the third voltage to generate a fourth voltage, i.e., a first output signal (OUT1), at the node (N2) that has an amplitude larger than the third voltage. The op-amp 310, in certain embodiments, may be implemented using any sort of transistors.

Figure 4:
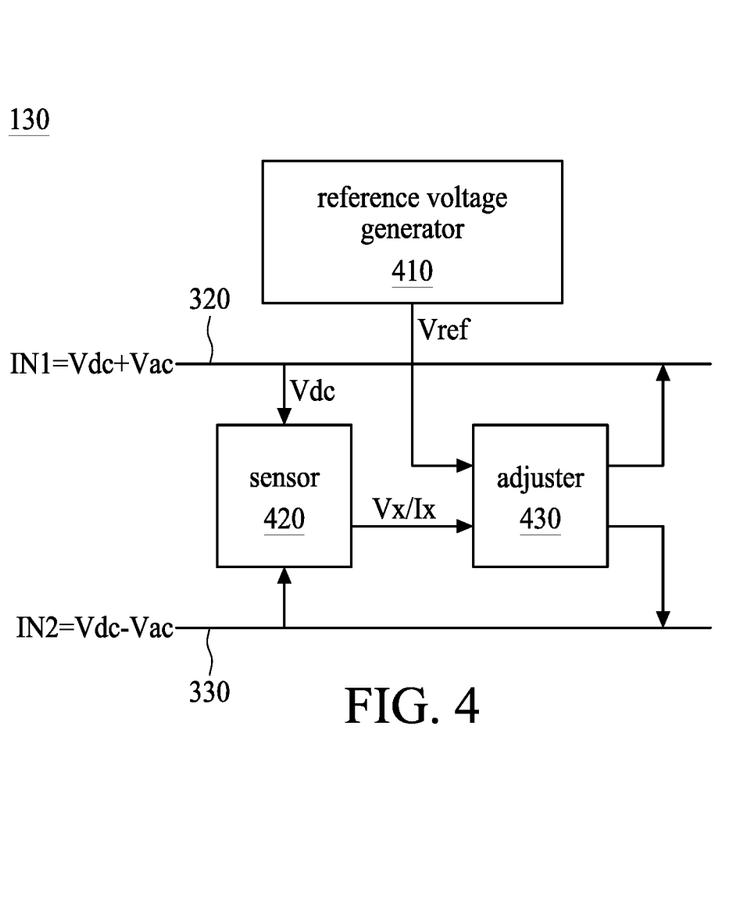
FIG. 4 is a schematic diagram illustrating an exemplary feedback mechanism in accordance with some embodiments.

Referring back to FIG. 1, the feedback mechanism 130 is configured to adjust a DC component (Vdc) of the input signal (IN1/IN2) to an amount of a reference voltage generated using a constant source current. As a result, a constant bias current (Ibias), i.e., a bias current independent of the PVT variations, flows from the first supply node 140 to the second supply node 150 through the converter 120. This will be described in greater detail hereinafter with further reference to FIGS. 4-7. FIGS. 4-7 depict example circuits for feedback mechanism 130. It is understood that these circuits are provided by way of example, not by limitation, and other suitable feedback mechanism 130 circuits are within the scope of the present disclosure. FIG. 4 is a schematic diagram illustrating an exemplary feedback mechanism 130 in accordance with some embodiments. The example of FIG. 4 includes a reference voltage generator 410, a sensor 420, and an adjuster 430.

Figure 5:
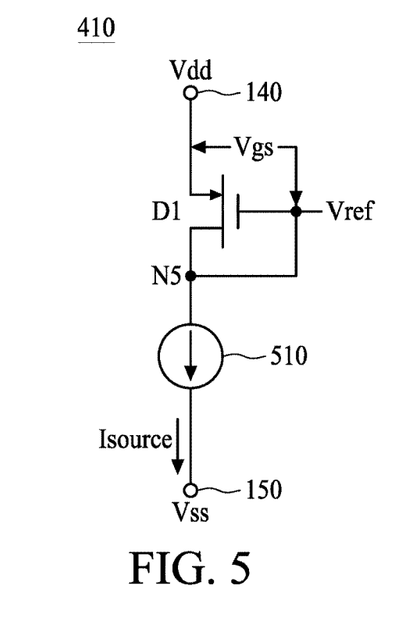
FIG. 5 is a schematic diagram illustrating an exemplary reference voltage generator in accordance with some embodiments.

The reference voltage generator 410 is configured to generate a reference voltage (Vref). For example, FIG. 5 is a schematic diagram illustrating an exemplary reference voltage generator 410 in accordance with some embodiments. As illustrated in FIG. 5, the reference voltage generator 410 includes a diode-connected FET (D1) connected between the first supply node 140 and a node (N5) and a current source 510 connected between the node (N5) and the second supply node 150. In operation, when the current source 510 generates a constant source current (Isource), a gate-to-source voltage (Vgs) occurs across source and gate terminals of the diode-connected FET (D1). This causes a reference voltage (Vref) substantially equal to the difference between the first supply voltage (Vdd) and the gate-to-source voltage (Vgs) to appear at the node (N5). In this embodiment, the FET (D1) is a p-type FET. In an alternative embodiment, the FET (D1) is an n-type FET, any sort of transistor, or other diode.

Referring back to FIG. 4, the sensor 420 is connected to the first and second input terminals 320, 330 of the converter 120 and is configured to detect the DC component (Vdc) to generate a sense voltage (Vx). The adjuster 430 is connected to the reference voltage generator 410 and the sensor 420 and is configured to amplify the difference between the reference voltage (Vref) and the sense voltage (Vx) to generate error voltages, based on which the DC component (Vdc) is adjusted to the reference voltage (Vref). In other words, the adjuster 430 functions to make the DC component (Vdc) equal to the reference voltage (Vref). For example, FIG. 6 is a schematic diagram illustrating exemplary sensor 420 and adjuster 430 in accordance with some embodiments.

Figure 6:
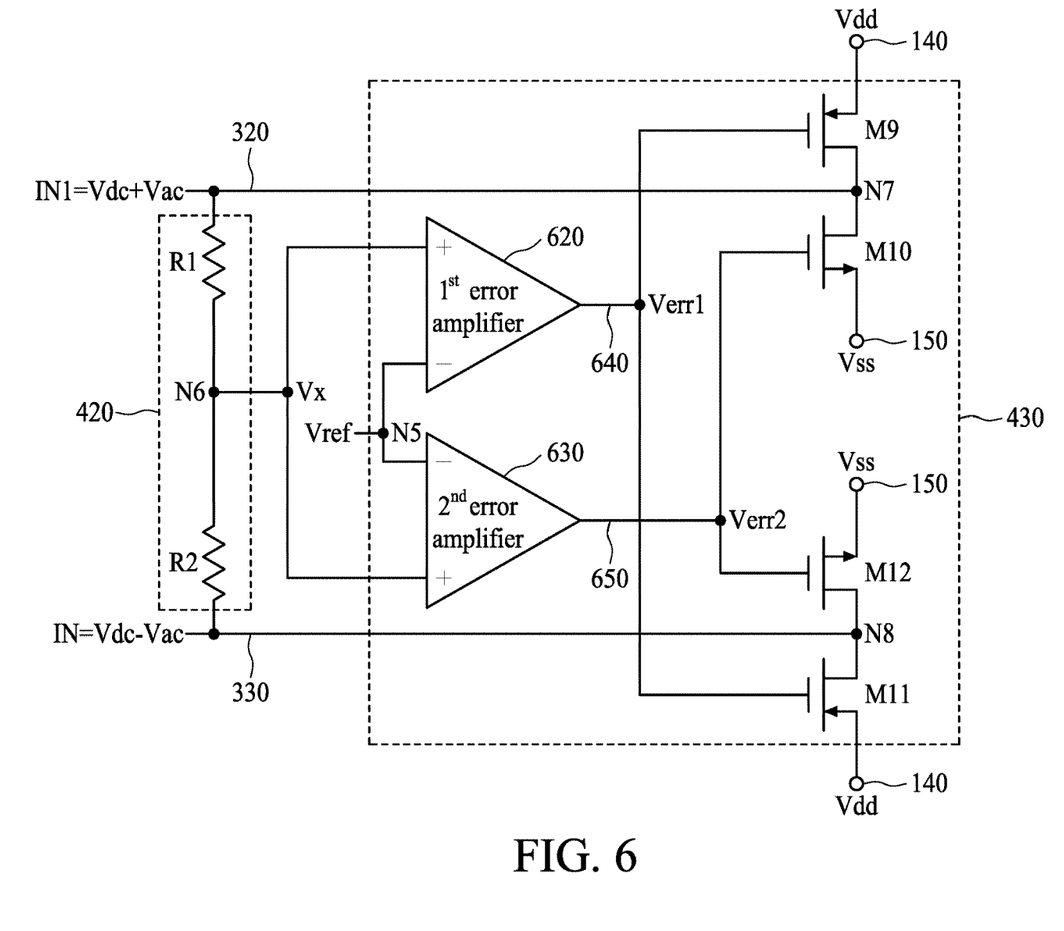
FIG. 6 is a schematic diagram illustrating exemplary sensor and adjuster in accordance with some embodiments.

As illustrated in FIG. 6, the sensor 420 includes a first resistor (R1) connected between the first input terminal 320 of the converter 120 and a node (N6) and a second resistor (R2) connected between the node (N6) and the second input terminal 330 of the converter 120. The first and second resistors (R1, R2) are configured to cancel the AC component (Vac) of the first input signal (IN1) and the AC component (−Vac) of the second input signal (IN2), detecting the DC component (Vdc), to generate the sense voltage (Vx) at the node (N6). In certain embodiments, the first and second resistors (R1, R2), which have large physical sizes, are replaced with transistors, e.g., FETs, which are far smaller than the resistors (R1, R2), minimizing an overall size of the semiconductor device 100.

As further illustrated in FIG. 6, the adjuster 430 includes first and second error amplifiers 620, 630, a first pair of p-type and n-type FETs (M9, M10), and a second pair of p-type and n-type FETs (M11, M12). The first error amplifier 620 has an inverting terminal connected to the node (N5) and a non-inverting terminal connected to the node (N6). The first error amplifier 620 is configured to amplify the difference between the voltages (Vref, Vx) to generate an error voltage (Verr1) at an output terminal 640 thereof. Similarly, the second error amplifier 630 has an inverting terminal connected to the node (N5) and a non-inverting terminal connected to the node (N6). The second error amplifier 630 is configured to amplify the difference between the voltages (Vref, Vx) to generate an error voltage (Verr2) at an output terminal 650 thereof.

The FETs (M9, M10) are connected in series between the first and second supply nodes 140, 150. Each of the FETs (M9, M10) is connected to the output terminal 640, 650 of a respective one of the first and second error amplifiers 620, 630. A node (N7) between the FETs (M9, M10) is connected to the first input terminal 320 of the converter 120. The FETs (M9, M10) are configured to receive the error voltages (Verr1, Verr2), respectively, to adjust the DC component (Vdc) amount to the reference voltage (Vref) amount. For example, when the sense voltage (Vx) is less than the reference voltage (Vref), the error voltages (Verr1, Verr2) cause the FET (M9) to be more conductive than the FET (M10). As a result, the DC component (Vdc) increases to the reference voltage (Vref). On the other hand, when the sense voltage (Vx) is greater than the reference voltage (Vref), the error voltages (Verr1, Verr2) cause the FET (M10) to be more conductive than the FET (M9). As a result, the DC component (Vdc) decreases to the reference voltage (Vref).

Similarly, the FETs (M11, M12) are connected in series between the first and second supply nodes 140, 150. Each of the FETs (M11, M12) is connected to the output terminal 640, 650 of the respective one of the first and second error amplifiers 620, 630. A node (N8) between the FETs (M11, M12) is connected to the second input terminal 330 of the converter 120. The FETs (M11, M12) are configured to receive the error voltages (Verr1, Verr2), respectively, to adjust the DC component (Vdc) amount to the reference voltage (Vref) amount. For example, when the sense voltage (Vx) is less than the reference voltage (Vref), the error voltages (Verr1, Verr2) cause the FET (M11) to be more conductive than the FET (M12). As a result, the DC component (Vdc) increases to the reference voltage (Vref). On the other hand, when the sense voltage (Vx) is greater than the reference voltage (Vref), the error voltages (Verr1, Verr2) cause the FET (M12) to be more conductive than the FET (M11). As a result, the DC component (Vdc) decreases to the reference voltage (Vref). The FETs (M9-M12) may be any sort of transistors in certain embodiments of the feedback mechanism 130.

In some embodiments, the adjuster 430 is configured to generate the error voltages (Verr1, Verr2) based on the difference between currents, instead of voltages (Vx, Vref). For example, FIG. 7 is a schematic diagram illustrating another exemplary sensor 420 and adjuster 430 in accordance with some embodiments.

Figure 7:
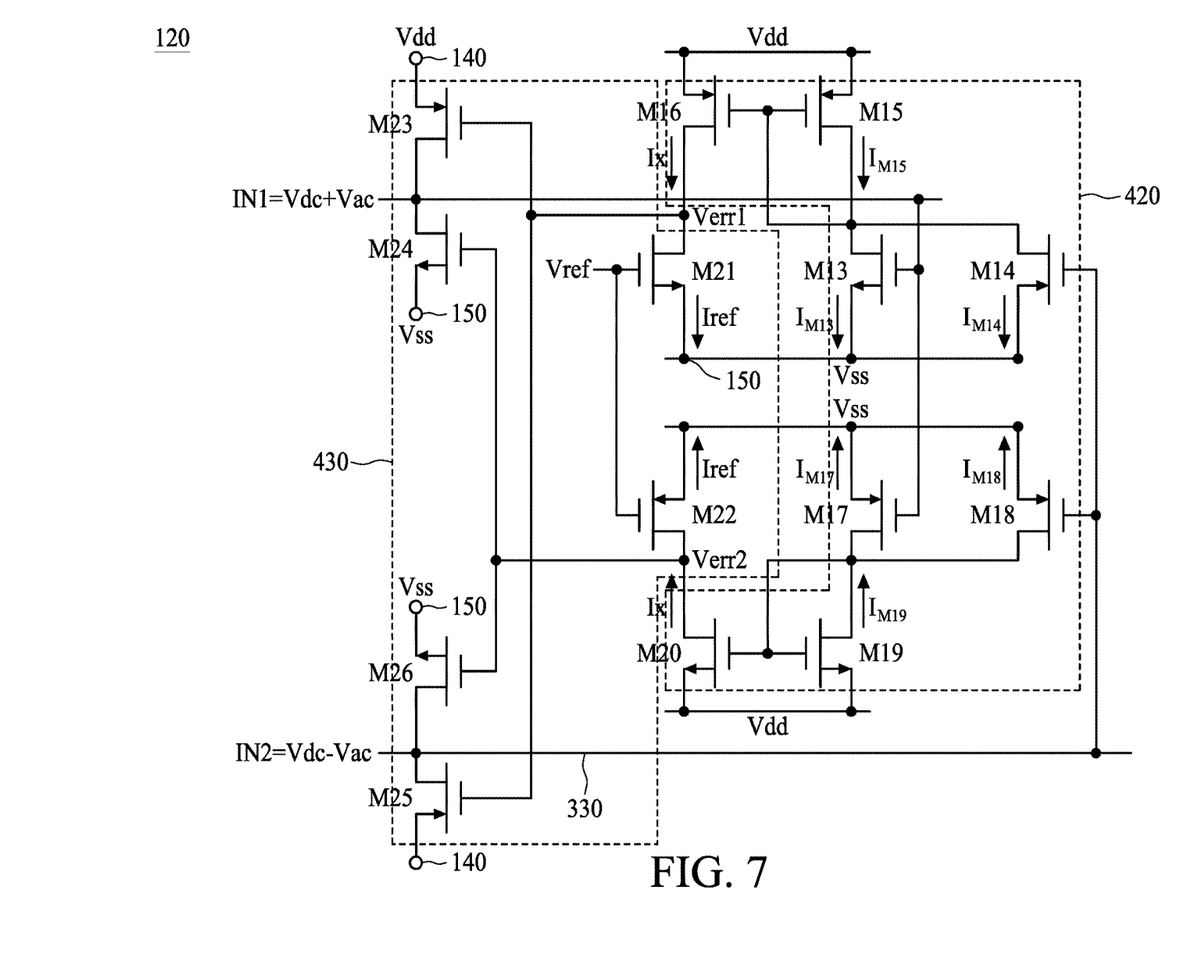
FIG. 7 is a schematic diagram illustrating another exemplary sensor and adjuster in accordance with some embodiments.

As illustrated in FIG. 7, the sensor 420 includes n-type and p-type FETs (M13-M20). The sensor 420 is configured to detect the DC component (Vdc) to generate a sense current (Ix) that flows through the FET (M16/M20). That is, the FET (M13) is configured to receive the first input signal (IN1) to generate a current ($I_{M13}$). The FET (M14) is configured to receive the second input signal (IN2) to generate a current ($I_{M14}$). The FET (M15) is a diode-connected FET and is configured to generate a current ($I_{M15}$) substantially equal to the sum of the currents ($I_{M13}$, $I_{M14}$). The FET (M16) is configured to mirror the current ($I_{M15}$) as the sense current (Ix) that flows therethrough. Similarly, the FET (M17) is configured to receive the first input signal (IN1) to generate a current ($I_{M17}$). The FET (M18) is configured to receive the second input signal (IN2) to generate a current ($I_{M18}$). The FET (M19) is a diode-connected FET and is configured to generate a current ($I_{M19}$) substantially equal to the sum of the currents ($I_{M17}$, $I_{M18}$). The FET (M20) is configured to mirror the current ($I_{M19}$) as the sense current (Ix) that flows therethrough.

As further illustrated in FIG. 7, the adjuster 430 includes n-type and p-type FETs (M21-M26). The FET (M21) is configured to receive the reference voltage (Vref) to generate a reference current (Iref) that flows therethrough. A node between the FETs (M16, M21) is configured to generate an error voltage (Verr1) that corresponds to the difference between the currents (Iref, Ix).

Similarly, the FET (M22) is configured to receive the reference voltage (Vref) to generate a reference current (Iref) therethrough. A node between the FETs (M20, M22) is configured to generate an error voltage (Verr2) that corresponds to the difference between the currents (Iref, Ix).

The FETs (M23, M24) are configured to receive the error voltages (Verr1, Verr2), respectively, to adjust the DC component (Vdc) amount to the reference voltage (Vref) amount. For example, when the sense current Ix) is less than the reference current (Iref), the error voltages (Verr1, Verr2) cause the FET (M23) to be more conductive than the FET (M24). As a result, the DC component (Vdc) increases to the reference voltage (Vref). On the other hand, when the sense current (Ix) is greater than the reference current (Iref), the error voltages (Verr1, Verr2) cause the FET (M24) to be more conductive than the FET (M23). As a result, the DC component (Vdc) decreases to the reference voltage (Vref).

Similarly, the FETs (M25, M26) are configured to receive the error voltages (Verr1, Verr2), respectively, to adjust the DC component (Vdc) amount to the reference voltage (Vref) amount. For example, when the sense current (Ix) is less than the reference current (Iref), the error voltages (Verr1, Verr2) cause the FET (M25) to be more conductive than the FET (M26). As a result, the DC component (Vdc) increases to the reference voltage (Vref). On the other hand, when the sense current (Ix) is greater than the reference current (Iref), the error voltages (Verr1, Verr2) cause the FET (M26) to be more conductive than the FET (M25). As a result, the DC component (Vdc) decreases to the reference voltage (Vref). The FETs (M13-M26) may be any sort of transistors in certain embodiments of the feedback mechanism 130. The FETs (M15, M19) may be replaced with other diodes.

From the above, the feedback mechanism 130 is mainly constructed from transistors, e.g., FETs and thus has a relatively high input and output impedances (indicated by arrow Zin1 and arrow Zout1 in FIG. 1, respectively). As such, the feedback mechanism 130 does not degrade the input signal (IN1/IN2). In some embodiments, the feedback mechanism 130 has input and output impedances (Zin1, Zout1) equal to input and output impedances (indicated by arrow Zin2 and arrow Zout2, respectively) of the converter 120. In other embodiments, the feedback mechanism 130 has input and output impedances (Zin1, Zout1) greater than the input and output impedances (Zin2, Zout2) of the converter 120.

Figure 8:
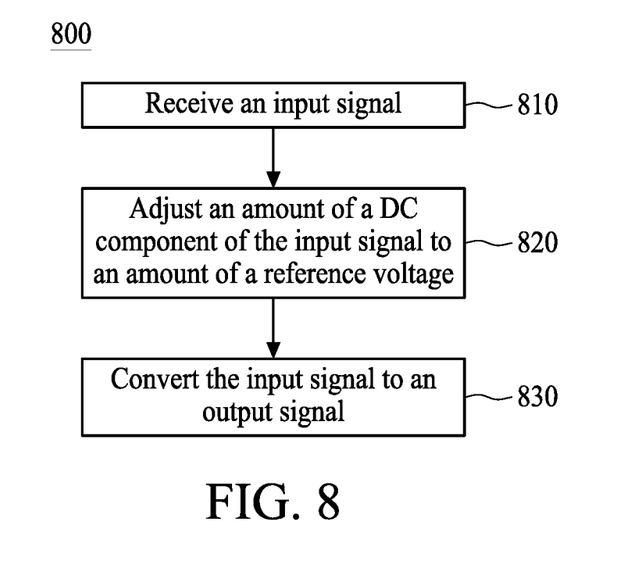
FIG. 8 is a flow chart illustrating an exemplary method for converting an input signal to an output signal in accordance with some embodiments.

FIG. 8 is a flow chart illustrating an exemplary method 800 of converting an input signal, e.g., a current signal, to an output signal, e.g., voltage signal, in accordance with some embodiments. Method 800 will now be described with further reference to FIGS. 3A, 3B, and 4-7 for ease of understanding. It is understood that method 800 is applicable to structures other than those of FIGS. 3A, 3B, and 4-7. Further, it is understood that additional operations can be provided before, during, and after method 800, and some of the operations described below can be replaced or eliminated, in an alternative embodiment of method 800. In operation 810, the input terminal 320 of the converter 120 receives an input signal (IN1).

Figure 9:
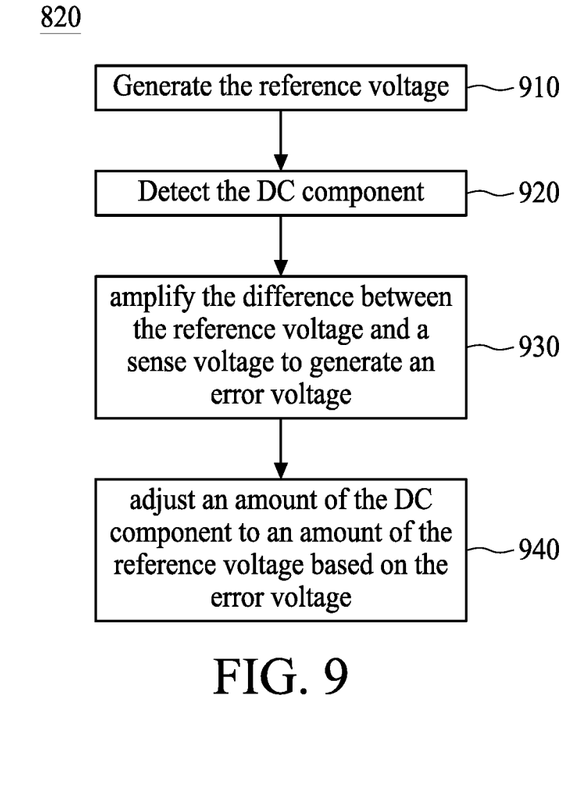
FIG. 9 is a flow chart illustrating an exemplary operation of a method for converting an input signal to an output signal in accordance with some embodiments.

In operation 820, the feedback mechanism 130 adjusts an amount of a DC component (Vdc) of the input signal (IN1) to an amount of a reference voltage (Vref). FIG. 9 is a flow chart illustrating an exemplary operation 820 of method 800 in accordance with some embodiments. In operation 910, the feedback mechanism 130 generates the reference voltage (Vref) using a constant source current (Isource). In operation 920, the feedback mechanism 130 detects the DC component (Vdc) to generate a sense voltage (Vx). In operation 930, the feedback mechanism 130 amplifies the difference between the reference voltage (Vref) and the sense voltage (Vx) to generate an error voltage (Verr1). In operation 940, the feedback mechanism 130 adjusts the DC component (Vdc) amount to the reference voltage (Vref) amount based on the error voltage (Verr1), whereby a constant bias current (Ibias) flows from the first supply node 140 to the second supply node 150 through the converter 120.

Figure 10:
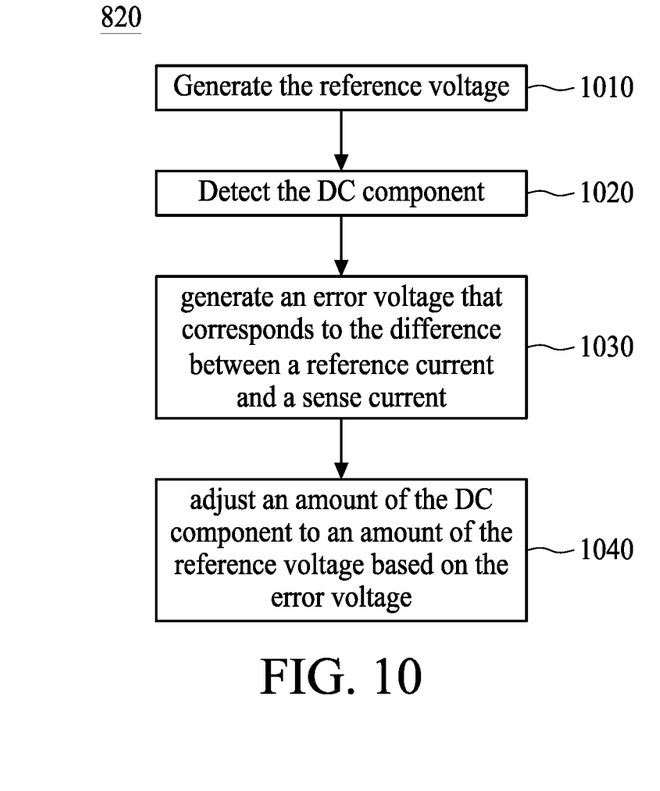
FIG. 10 is a flow chart illustrating an exemplary operation of a method for converting an input signal to an output signal in accordance with some embodiments.

FIG. 10 is a flow chart illustrating another exemplary operation 820 of method 800 in accordance with some embodiments. In operation 1010, the feedback mechanism 130 generates the reference voltage (Vref) using a constant source current (Isource). In operation 1020, the feedback mechanism 130 detects the DC component (Vdc) to generate a sense current (Ix). Next, the feedback mechanism 130 receives the reference voltage (Vref) to generate a reference current (Iref). In operation 1030, the feedback mechanism 130 generates an error voltage (Verr1) that corresponds to the difference between the reference current (Iref) and the sense current (Ix). In operation 1040, the feedback mechanism 130 adjusts the DC component (Vdc) amount to the reference voltage (Vref) amount based on the error voltage (Verr1), whereby a constant bias current (Ibias) flows from the first supply node 140 to the second supply node 150 through the converter 120.

Referring back to FIG. 8, in operation 830, the converter 120 amplifies the input signal (IN1) to generate an output signal (OUT1) at the output terminal 340 thereof.

In an embodiment, an amplifying unit comprises a converter and a feedback mechanism. The converter has a supply input coupled to a supply node. The converter further has an input terminal configured to receive an input signal. The converter is configured to amplify the input signal from the input terminal to generate an output signal. The feedback mechanism is coupled to the input terminal of the converter and is configured to cause a constant bias current to flow from the supply node through the converter based on the input signal.

In another embodiment, a semiconductor device comprises a module, a converter, and a feedback mechanism. The module is configured to generate an input signal. The converter has a supply input coupled to a supply node. The converter further has an input terminal configured to receive the input signal. The converter is configured to amplify the input signal from the input terminal to generate an output signal. The feedback mechanism is coupled to the input terminal of the converter and is configured to cause a constant bias current to flow from the supply node through the converter based on the input signal.

In another embodiment, a method comprises receiving an input signal, generating a reference voltage using a constant source current, adjusting an amount of a direct current (DC) component of the input signal to an amount of the reference voltage, and converting the input signal to an output signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An amplifying unit comprising:
a converter having a supply input coupled to a supply node, the converter further having an input terminal configured to receive an input signal, the converter being configured to amplify the input signal from the input terminal to generate an output signal; and
a feedback mechanism coupled to the input terminal of the converter and configured to cause a constant bias current to flow from the supply node through the converter based on the input signal, the feedback mechanism comprising an adjuster, the adjuster comprising first and second amplifiers, the first amplifier generating a first error voltage, and the second amplifier generating a second error voltage, an output voltage of the feedback mechanism being based on the first and second error voltages.

2. The amplifying unit of claim 1, wherein the feedback mechanism includes:
a reference voltage generator configured to generate a reference voltage; and
a sensor configured to detect a direct current (DC) component of the input signal to generate a sense signal.

3. The amplifying unit of claim 2, wherein the adjuster is further configured to amplify the difference between the reference voltage and the sense signal to generate an error signal and to increase or decrease the DC component amount to the reference voltage amount based on the error signal.

4. The amplifying unit of claim 2, wherein the adjuster is further configured to receive the reference voltage to generate a reference current and to generate an error signal that corresponds to the difference between the reference current and the sense signal and to increase or decrease the DC component amount to the reference voltage amount based on the error signal.

5. The amplifying unit of claim 1, wherein the feedback mechanism includes a reference voltage generator configured to generate a reference voltage.

6. The amplifying unit of claim 5, wherein the reference voltage generator includes a current source configured to generate a constant source current.

7. The amplifying unit of claim 1, further comprising a sensor coupled to the input terminal of the converter and configured to detect a DC component of the input signal to generate a sense voltage.

8. The amplifying unit of claim 1, wherein the converter is a current-to-voltage converter.

9. The amplifying unit of claim 1, wherein the converter is a fully differential amplifier.

10. The amplifying unit of claim 1, further comprising a signal generator configured to:
receive a control signal and a radio frequency input signal; and
generate a radio frequency output signal.

11. The amplifying unit of claim 2, wherein the sensor is further configured to cancel an alternating current (AC) component of the input signal to generate the sense signal.

12. A semiconductor device comprising:
a module configured to generate an input signal;
a converter having a supply input coupled to a supply node, the converter further having an input terminal configured to receive the input signal, the converter being configured to amplify the input signal from the input terminal to generate an output signal; and
a feedback mechanism coupled to the input terminal of the converter and configured to cause a constant bias current to flow from the supply node through the converter based on the input signal, the feedback mechanism comprising an adjuster, the adjuster comprising first and second amplifiers, the first amplifier generating a first error voltage, and the second amplifier generating a second error voltage, an output voltage of the feedback mechanism being based on the first and second error voltages.

13. The semiconductor device of claim 12, wherein the sensor is further configured to cancel an alternating current (AC) component of the input signal to generate the sense signal.

14. A method comprising:
receiving an input signal;
generating a reference voltage using a constant source current;
generating positive and negative differences between an amount of a direct current (DC) component of the input signal and the reference voltage;
adjusting the amount of the DC component of the input signal to an amount of the reference voltage based on positive and negative differences; and
converting the input signal to an output signal based on the adjusted amount of the DC component of the input signal.

15. The method of claim 14, further comprising:
detecting the DC component to generate a sense signal; and
adjusting the direct current (DC) component amount to the reference voltage amount using the sense signal.

16. The method of claim 15, further comprising:
amplifying the difference between the reference voltage and the sense signal to generate an error signal; and
increasing or decreasing the direct current (DC) component amount to the reference voltage amount based on the error signal.

17. The method of claim 14, further comprising converting the input signal that is a current signal to the output signal that is a voltage signal.

18. The method of claim 14, further comprising:
receiving a second input signal identical to, but 180 degrees out-of-phase with, the input signal; and amplifying the second input signal to generate a second output signal.

19. The method of claim 14, further comprising generating a constant bias current based on the input signal.

20. The method of claim 14, further comprising:
canceling an amount of an alternating current (AC) component of the input signal prior to generating the positive and negative differences.

* * * * *